(12) United States Patent
Hu

(10) Patent No.: US 12,279,485 B2
(45) Date of Patent: Apr. 15, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Peng Hu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/283,639

(22) PCT Filed: Feb. 5, 2021

(86) PCT No.: PCT/CN2021/075395
§ 371 (c)(1),
(2) Date: Apr. 8, 2021

(87) PCT Pub. No.: WO2022/147875
PCT Pub. Date: Jul. 14, 2022

(65) Prior Publication Data
US 2024/0130172 A1 Apr. 18, 2024

(30) Foreign Application Priority Data
Jan. 8, 2021 (CN) .......................... 202110024931.5

(51) Int. Cl.
H10K 59/124 (2023.01)
H10K 59/40 (2023.01)
H10K 59/80 (2023.01)

(52) U.S. Cl.
CPC .......... H10K 59/124 (2023.02); H10K 59/40 (2023.02); H10K 59/8731 (2023.02)

(58) Field of Classification Search
CPC ................. H10K 59/124; H10K 59/40; H10K 59/8731
See application file for complete search history.

(56) References Cited

U.S. PATENT DOCUMENTS

2014/0346947 A1* 11/2014 Kim ...................... G06F 1/1637
313/512
2017/0069701 A1* 3/2017 Cai ........................ H10K 71/00
2017/0117502 A1* 4/2017 Park ..................... H10K 59/124
(Continued)

FOREIGN PATENT DOCUMENTS

| CN | 105576149 A | 5/2016 |
| CN | 106997930 A | 8/2017 |

(Continued)

Primary Examiner — Bitew A Dinke
(74) Attorney, Agent, or Firm — PV IP PC; Wei Te Chung; Christopher S Ruprecht

(57) ABSTRACT

A display panel and a display device are provided. At four corners of the display panel where a first inorganic layer and a second inorganic layer are attached, the display panel is defined with a through hole filled with a stress-buffering component. As a result, stresses on a bending area of the display panel are reduced by the stress-buffering component, and the display panel is prevented from breakage due to stress concentration.

20 Claims, 13 Drawing Sheets

(56) References Cited

U.S. PATENT DOCUMENTS

| | | | |
|---|---|---|---|
| 2017/0194404 A1* | 7/2017 | Park | H10K 59/124 |
| 2018/0108863 A1* | 4/2018 | Kajiyama | H10K 59/8731 |
| 2020/0150725 A1 | 5/2020 | Saitoh et al. | |
| 2020/0176696 A1* | 6/2020 | Dai | H10K 59/131 |
| 2020/0185423 A1* | 6/2020 | Hu | H01L 27/1218 |
| 2020/0273930 A1* | 8/2020 | Zhou | H10K 71/00 |
| 2020/0395573 A1* | 12/2020 | Zhang | H10K 59/8731 |
| 2020/0403179 A1* | 12/2020 | Hu | H10K 50/844 |
| 2021/0083208 A1* | 3/2021 | Yu | H10K 71/00 |
| 2021/0091320 A1* | 3/2021 | Choi | G06F 1/1656 |
| 2021/0143364 A1* | 5/2021 | Jin | H10K 59/124 |
| 2021/0183970 A1* | 6/2021 | Wang | H10K 77/111 |
| 2021/0408189 A1* | 12/2021 | Zhou, | H10K 77/111 |
| 2022/0085305 A1* | 3/2022 | Zhao | H10K 59/131 |
| 2022/0085321 A1* | 3/2022 | Wang | G06F 1/1637 |
| 2022/0115452 A1* | 4/2022 | Hou | H10K 71/80 |
| 2022/0308625 A1* | 9/2022 | Gao, Sr. | G06F 1/1628 |
| 2022/0320465 A1* | 10/2022 | Hou | H10K 59/8731 |
| 2023/0026482 A1* | 1/2023 | Wang | G06F 1/1652 |
| 2023/0111683 A1* | 4/2023 | Wang | G06F 1/1637 |
| | | | 345/55 |

FOREIGN PATENT DOCUMENTS

| | | | | |
|---|---|---|---|---|
| CN | 108598287 | A | 9/2018 | |
| CN | 109461829 | A | 3/2019 | |
| CN | 109616506 | A | 4/2019 | |
| CN | 110943108 | A | 3/2020 | |
| CN | 111179777 | A | 5/2020 | |
| CN | 111200082 | A | 5/2020 | |
| CN | 111244322 | A | 6/2020 | |
| CN | 111261642 | A | 6/2020 | |
| CN | 111509022 | A | 8/2020 | |
| CN | 111554190 | A | 8/2020 | |
| CN | 111627332 | A | 9/2020 | |
| CN | 111640881 | A | 9/2020 | |
| CN | 112002248 | A | 11/2020 | |
| CN | 112071881 | A | 12/2020 | |
| WO | WO-2020051962 | A1 * | 3/2020 | H01L 27/1218 |

* cited by examiner

DISPLAY PANEL AND DISPLAY DEVICE

FIELD

The present disclosure relates to the field of display technologies and more particularly to a display panel and a display device.

BACKGROUND

For conventional display devices, to increase a screen-to-body ratio and realize a full-screen panel, four corners of the display devices are bent, thereby enabling four lateral edges of the display devices to display content. As a result, the screen-to-body ratio of the display devices can be increased, and the full-screen panel can be realized by an under-display camera. However, a junction area is generated at a bending area of the display panel since four lateral edges of the display panels are bent. Stresses concentrate on the junction area, resulting in breakage of the display devices, and leading to black spots generated during display. Furthermore, breakage of an encapsulation layer would cause failure of encapsulation of the display devices.

Thus, conventional display devices with curved surfaces at four lateral edges have a technical problem of stresses concentrating on a junction area of a bending area, resulting in breakage of the display devices.

SUMMARY

Embodiments of the present disclosure provide a display panel and a display device to solve a following problem: in conventional display devices with curved surfaces at four edges, stresses concentrate on a junction area of a bending area, resulting in breakage of the display devices.

To solve the above problem, the present disclosure provides a technical solution below.

An embodiment of the present disclosure provides a display panel, comprising a display area and a non-display area defined around the display area, wherein the display panel comprises:

a substrate;
a driving circuit layer disposed on a side of the substrate;
an encapsulation layer disposed on a side of the driving circuit layer away from the substrate, wherein the encapsulation layer comprises a first inorganic layer, an organic layer, and a second inorganic layer;
wherein at four corners of the display panel where the first inorganic layer and the second inorganic layer are attached in the non-display area, the display panel is provided with a through hole filled with a stress-buffering component configured to reduce stress.

In some embodiments, the display panel comprises a first area, a second area, a third area, and a fourth area at four corners of the display panel, and the first area, the second area, the third area, and the fourth area are provided each with the through hole.

In some embodiments, the display panel comprises a buffer layer and a touch control layer, the driving circuit layer comprises a gate insulating layer and an interlayer insulating layer, the touch control layer comprises an isolating layer, the through hole penetrates at least one of the buffer layers, the gate insulating layer, the interlayer insulating layer, the first inorganic layer, the second inorganic layer, or the isolating layer.

In some embodiments, the through hole comprises a first through hole formed in the buffer layer and a second through hole formed in the gate insulating layer, the interlayer insulating layer, the first inorganic layer, the second inorganic layer, and the isolating layer.

In some embodiments, a projection of the first through hole overlaps a projection of the second through hole on the substrate.

In some embodiments, the first area is provided with at least two through holes, and the at least two through holes are evenly distributed along a curved surface of the display panel in the first area.

In some embodiments, a distance between a projection of the first through hole and a projection of the second through hole on the substrate is greater than 0.

In some embodiments, the second through hole comprises a first sub-through hole formed in the gate insulating layer, a second sub-through hole formed in the interlayer insulating layer, and a third sub-through hole formed in the encapsulation layer, and distances between a projection of the first sub-through hole, a projection of the second sub-through hole, a projection of the third sub-through hole on the substrate are greater than 0.

In some embodiments, the display panel comprises a planarization layer disposed in a direction of the interlayer insulating layer away from the substrate and filled in the second sub-through hole to form a first part of the stress-buffering component, a second part of the stress-buffering component is filled in the first sub-through hole, and a third part of the stress-buffering component is filled in the third sub-through hole.

In some embodiments, the stress-buffering component comprises an organic material.

In some embodiments, the display panel further comprises a planarization layer disposed in a direction of the touch control layer away from the substrate and filled in the through hole to form the stress-buffering component.

Furthermore, an embodiment of the present disclosure provides a display device, comprising:

a display panel; wherein the display panel comprises a display area and a non-display area defined around the display area, the display panel comprises a substrate, a driving circuit layer, and an encapsulation layer, the driving circuit layer is disposed on a side of the substrate, the encapsulation layer is disposed on a side of the driving circuit layer away from the substrate, the encapsulation layer comprises a first inorganic layer, an organic layer, and a second inorganic layer; and wherein at four corners of the display panel where the first inorganic layer and the second inorganic layer are attached in the non-display area, the display panel is provided with a through hole filled with a stress-buffering component configured to reduce stress; and
a cover plate disposed on a side of the display panel.

In some embodiments, the display panel comprises a first area, a second area, a third area, and a fourth area at four corners of the display panel, and the first area, the second area, the third area, and the fourth area are each provided with the through hole.

In some embodiments, the display panel comprises a buffer layer and a touch control layer, the driving circuit layer comprises a gate insulating layer and an interlayer insulating layer, the touch control layer comprises an isolating layer, the through hole penetrates at least one of the buffer layers, the gate insulating layer, the interlayer insulating layer, the first inorganic layer, the second inorganic layer, or the isolating layer.

In some embodiments, the through hole comprises a first through hole formed in the buffer layer and the second through hole formed in the gate insulating layer, the interlayer insulating layer, the first inorganic layer, the second inorganic layer, and the isolating layer.

In some embodiments, a projection of the first through hole overlaps a projection of the second through hole on the substrate.

In some embodiments, the first area is provided with at least two through holes, and the at least two through holes are evenly distributed along a curved surface of the display panel in the first area.

In some embodiments, a distance between a projection of the first through hole and a projection of the second through hole on the substrate is greater than 0.

In some embodiments, the second through hole comprises a first sub-through hole formed in the gate insulating layer, a second sub-through hole formed in the interlayer insulating layer, and a third sub-through hole formed in the encapsulation layer, and distances between a projection of the first sub-through hole, a projection of the second sub-through hole, a projection of the third sub-through hole on the substrate are greater than 0.

In some embodiments, the display panel comprises a planarization layer disposed in a direction of the interlayer insulating layer away from the substrate and filled in the second sub-through hole to form a first part of the stress-buffering component, a second part of the stress-buffering component is filled in the first sub-through hole, and a third part of the stress-buffering component is filled in the third sub-through hole.

Regarding the beneficial effects: embodiments of the present disclosure provide a display panel and a display device. The display panel comprises a display area and a non-display area defined around the display area. The display panel comprises a substrate, a driving circuit layer, and an encapsulation layer, the driving circuit layer is disposed on a side of the substrate. The encapsulation layer is disposed on a side of the driving circuit layer away from the substrate. The encapsulation layer comprises a first inorganic layer, an organic layer, and a second inorganic layer. At four corners of the display panel where the first inorganic layer and the second inorganic layer are attached in the non-display area, the display panel is provided with a through hole filled with a stress-buffering component configured to reduce stress. Since stresses on the bending area of the display panel are reduced by the stress-buffering component, the display panel is prevented from breakage due to a stress concentration.

DETAILED DESCRIPTION

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

Embodiments of the present disclosure solve a following technical problem: in conventional display devices with curved surfaces at four edges, stresses concentrating on a junction area of a bending area, resulting in breakage of the display devices.

Figure 1:
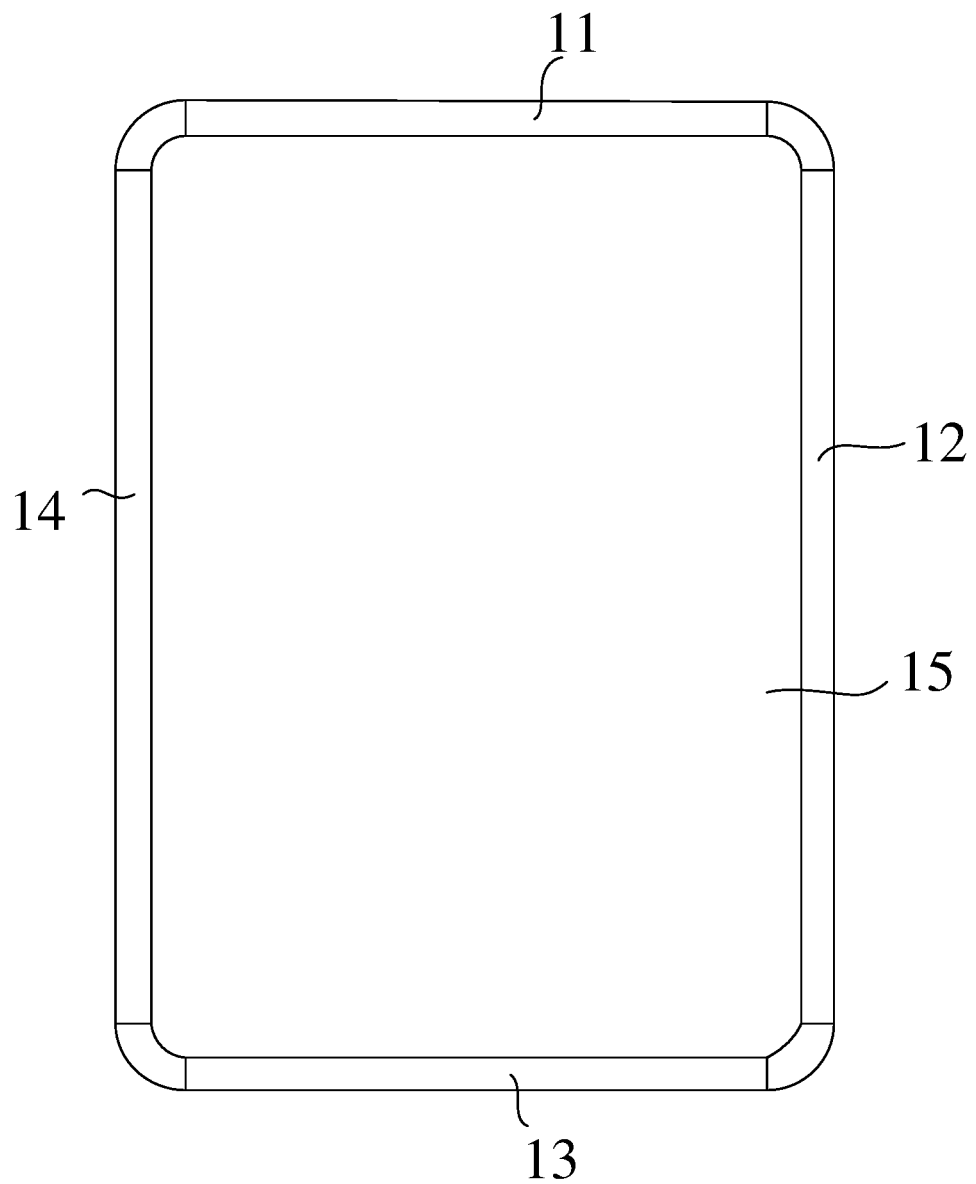
FIG. 1 is a first schematic view showing a conventional display device.
Figure 2:
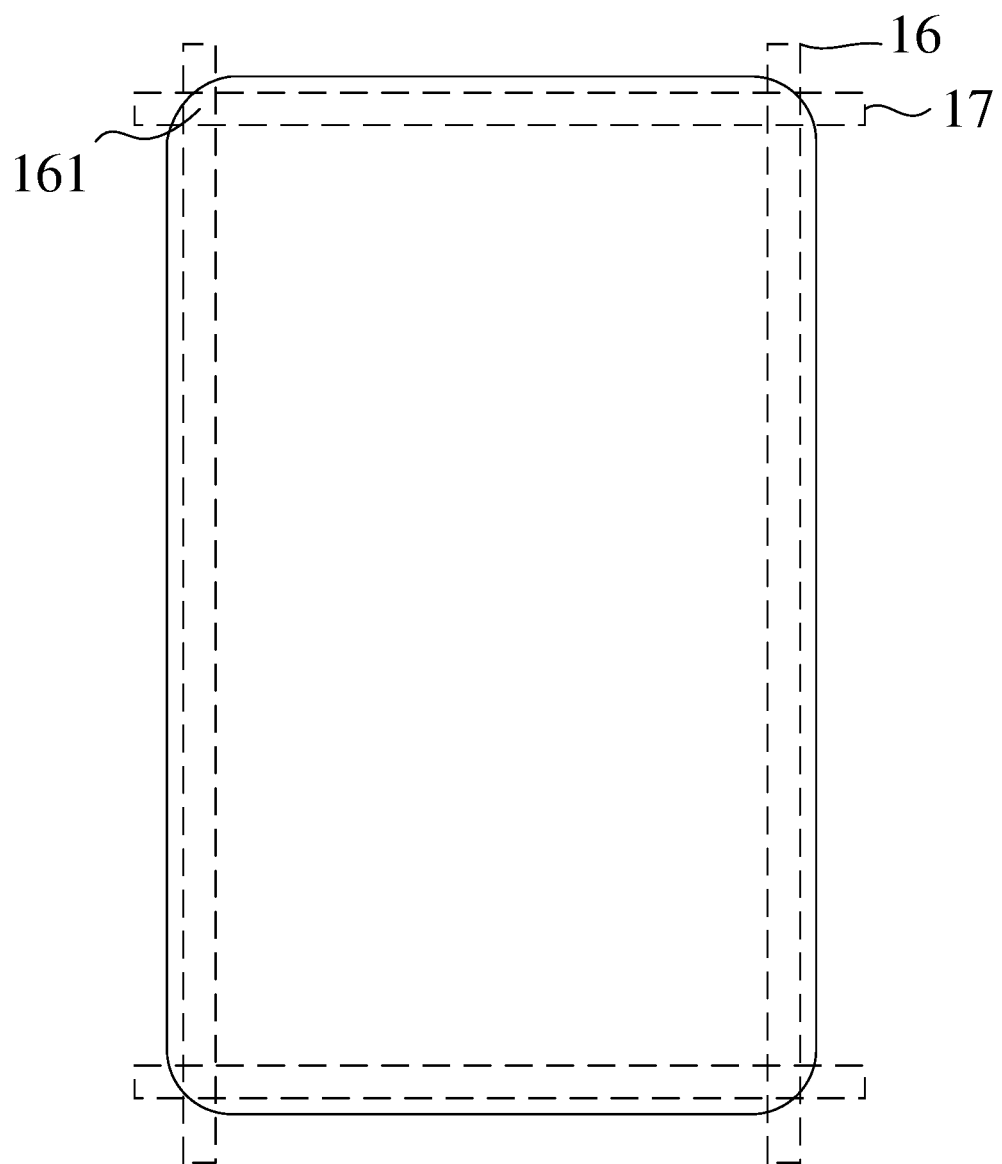
FIG. 2 is a second schematic view showing the conventional display device.
Figure 3:
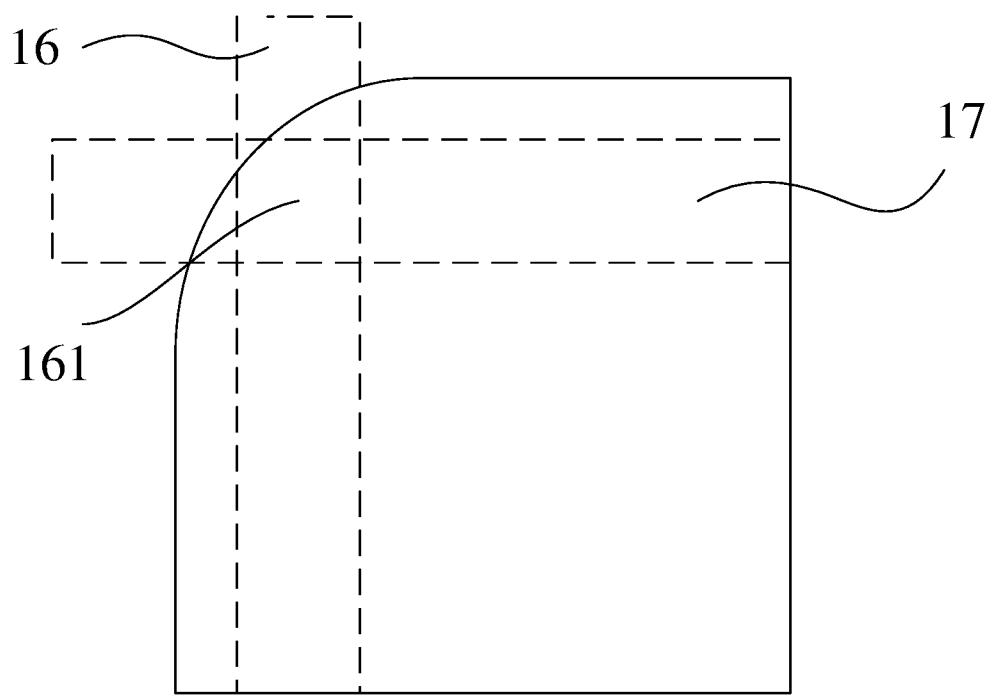
FIG. 3 is an enlarged schematic view showing a bending junction area of the conventional display device.
Figure 4:
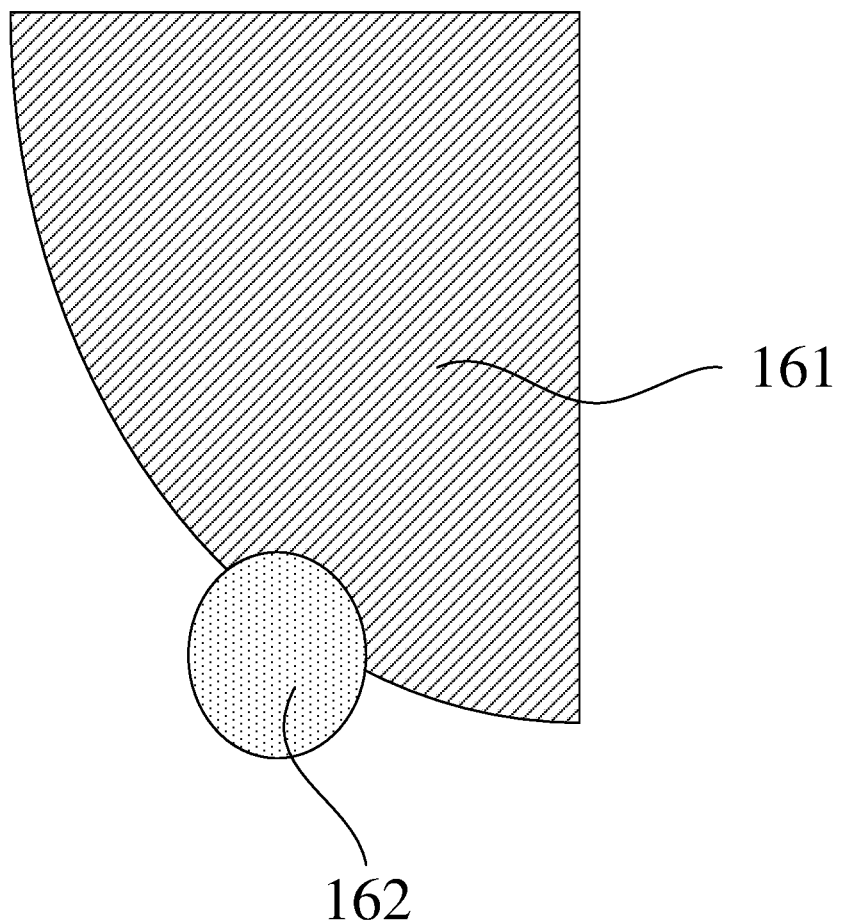
FIG. 4 is a schematic view showing abnormal display at the bending junction area of the conventional display device.

As shown in FIG. 1, four edges of a conventional display device are bent to increase a screen-to-body ratio, thereby enabling four edges of the display device to display contents. Specifically, the display device comprises a first display area 11, a second display area 12, a third display area 13, and a fourth display area 14 which are defined at the edges of the display device, and a display area 15 defined at a front surface of the display device. The edges of the display device are formed by bending. As shown in FIG. 2, a bending area 16 and a bending area 17 of the display device are bent. However, during a bending process, as shown in FIG. 2 and FIG. 3, a junction area 161 is generated at a junction between the bending area 16 and the bending area 17, and stresses would concentrate on the junction area 161. As shown in FIG. 4, the display device is broken, and a black spot 162 appears during display, which affects a display effect. Furthermore, breakage of the display device leads to failure of an encapsulation layer, which affects a yield rate of the display device. As a result, in conventional display devices with curved surfaces at four edges, stresses concentrating on a junction area of a bending area, resulting in breakage of the display devices.

Figure 5:
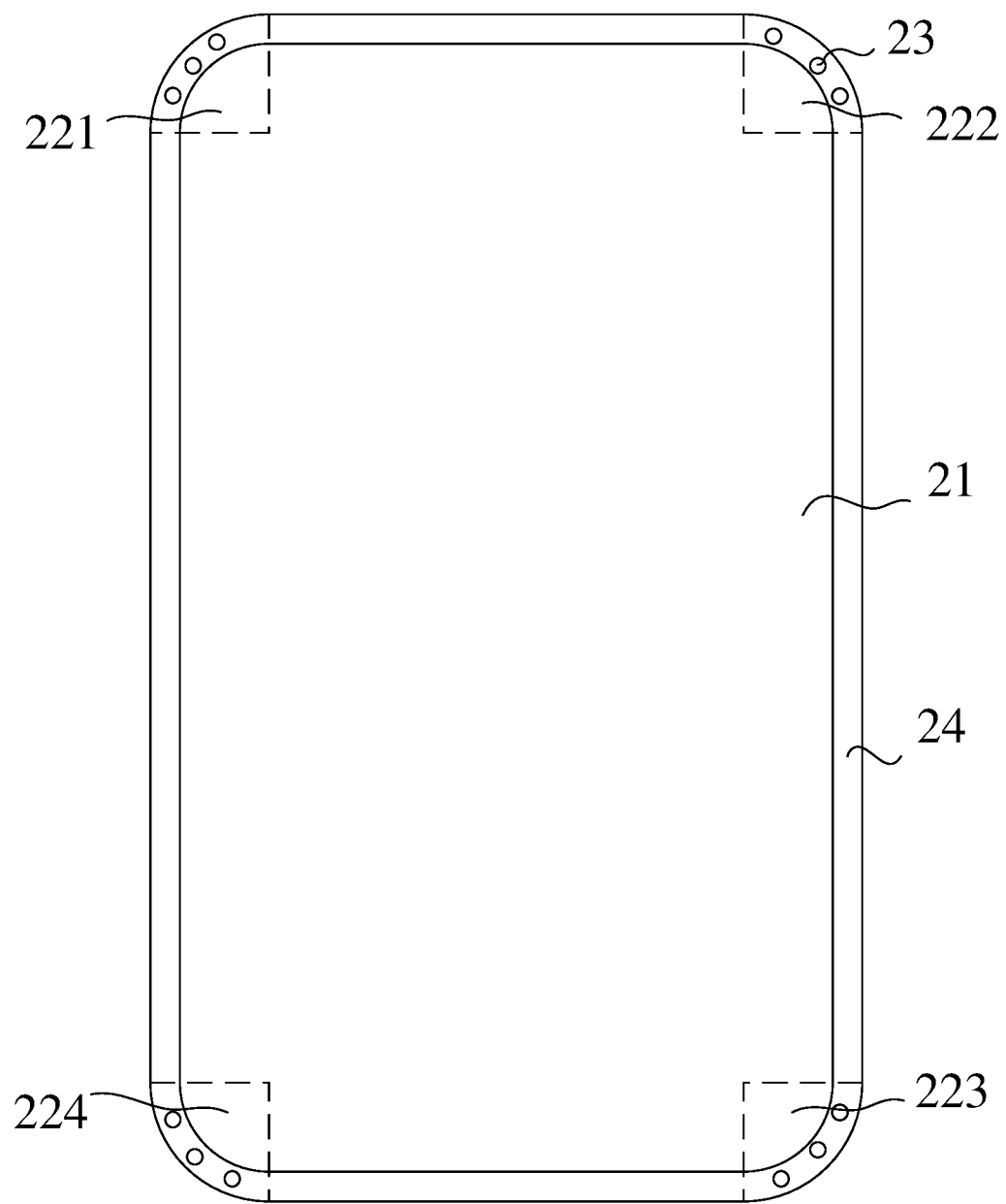
FIG. 5 is a first schematic view showing a display panel provided by an embodiment of the present disclosure.
Figure 6:
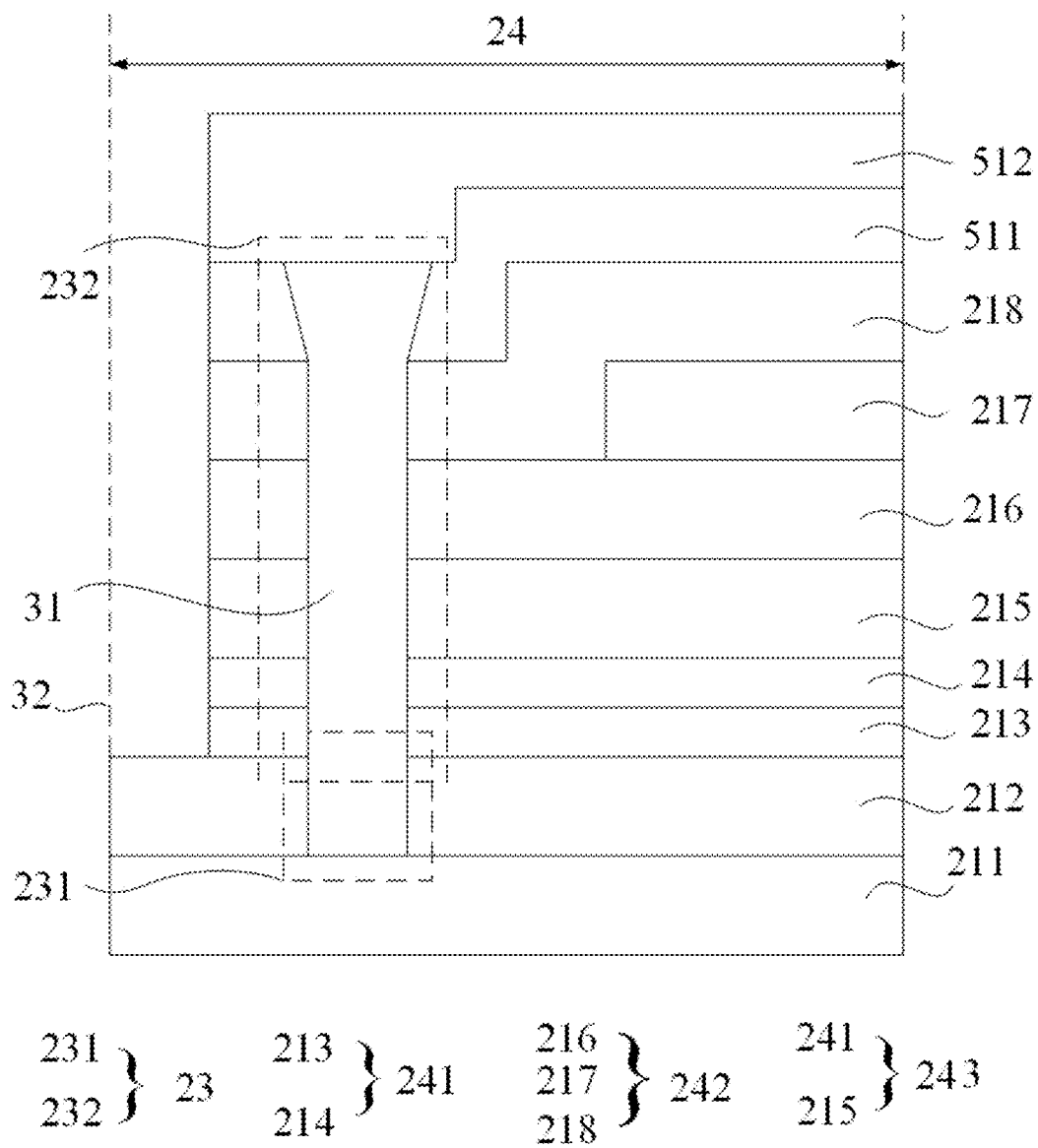
FIG. 6 is a second schematic view showing the display panel provided by an embodiment of the present disclosure.

As shown in FIG. 5 and FIG. 6, an embodiment of the present disclosure provides a display panel, comprising a display area 21 and a non-display area 24 surrounding the display area 21. The display panel comprises:

a substrate 211;
a driving circuit layer disposed on a side of the substrate 211;
an encapsulation layer 242 disposed on a side of the driving circuit layer away from the substrate 211. The encapsulation layer 242 comprises a first inorganic layer 216, an organic layer 217, and a second inorganic layer 218.

At four corners 22 of the display panel where the first inorganic layer 216 and the second inorganic layer 218 are attached in the non-display area 24, the display panel is defined with a through hole 23 filled with a stress-buffering component 31 configured to reduce stress.

An embodiment of the present disclosure provides a display panel. At four corners of the display panel where a first inorganic layer and a second inorganic layer are attached in a non-display area, the display panel is defined with a through hole filled with a stress-buffering component configured to reduce stress. As a result, the stress-buffering component can reduce stresses on a bending area of the display panel, and the display panel can be prevented from breakage due to stress concentration. In FIG. 5, the through hole 23 is filled with the stress-buffering component and is shown for a purpose of illustrating its position. It should be noted that the through hole cannot be seen in actual situations.

It should be noted that in FIG. 6, the display panel is cut downwardly with respect to a cutting line 32 during a cutting process, thereby dividing a motherboard into multiple display panels. In one embodiment, a first through hole is defined in a buffer layer 212. Cracks generated during the cutting process would not continuously extend, so that the display panel would not be affected.

In FIG. 6, the stress-buffering component 31 is filled in a first through hole 231 and a second through hole 232. Therefore, the first through hole and the second through hole cannot be seen in FIG. 6. Areas corresponding to dotted frames are the first through hole and the second through hole.

In one embodiment, the display panel comprises a first area, a second area, a third area, and a fourth area disposed at four corners of the display panel. At least one of the first area, the second area, the third area, or the fourth area is defined with the through hole. That is, it is allowed to define the through hole at only one of the four corners, thereby reducing stresses on such corner and preventing the display panel from breakage due to stresses concentrating on such corner. Specifically, forming a through hole in just the first area is allowed. The second area, the third area, and the fourth area are not defined with the through hole. Therefore, stresses on the first area can be reduced, and the display panel can be prevented from breakage due to stresses concentrating on the first area. However, embodiments of the present disclosure are not limited to the above design. It is allowed to define the through hole at two areas or three areas, thereby reducing stresses on the two areas or the three areas. As a result, stress on each area of the display panel can be reduced, and the display panel can be prevented from breakage.

In one embodiment, as shown in FIG. 5, the display panel comprises a first area 221, a second area 222, a third area 223, and a fourth area 224 defined at four corners of the display panel. The first area 221, the second area 222, the third area 223, and the fourth area 224 are each defined with the through hole 23. Considering that stresses would concentrate on four corners of the display panel during a bending process, the stress-buffering component is filled in the through holes to reduce stresses on the four corners. As a result, stresses are prevented from concentration, and the display play is prevented from breakage.

In one embodiment, the display panel comprises a first area and a second area defined on a side of a terminal area, and a third area and a fourth area defined on another side of the terminal area. The third area and the fourth area are each defined with a through hole, and the first area and the second area are not defined with a through hole. In display panels only having two bending areas, the through holes can be defined in the third area and the fourth area, thereby reducing stresses on the bending areas and preventing the display panel from breakage due to stress concentration.

In one embodiment, as shown in FIG. 6, the display panel further comprises a buffer layer 212 and a touch control layer 511. The driving circuit layer comprises a gate insulating layer 241 and an interlayer insulating layer 215. The touch control layer 511 comprises an isolating layer 511. The gate insulating layer 241 comprises a first gate insulating layer 213 and a second gate insulating layer 214. The through hole 23 penetrates at least one of the buffer layer 212, the gate insulating layer 241, the interlayer insulating layer 215, the first inorganic layer 216, the second inorganic layer 218, or the isolating layer 511. Considering that stresses on the display panel need to be reduced, the through hole penetrates at least one of the first gate insulating layer, the second gate insulating layer, the interlayer insulating layer, the first inorganic layer, the second inorganic layer, or the isolating layer. Therefore, when the display panel is bent, stresses on the inorganic layer can be reduced because the through hole penetrates the inorganic layer. As a result, stresses are prevented from concentrating on the display panel, and the display panel is prevented from breakage.

In one embodiment, the touch control layer comprises a control metal layer and an isolating layer, as shown in FIG. 6. The control metal layer is not shown. Hence, the touch control layer and the isolating layer share the same reference number 511. As shown in FIG. 6, the second through hole 232 penetrates the isolating layer. In display devices having a direct-on-cell-touch (DOT) design that directly forms the touch control layer on the encapsulation layer, all inorganic layers from the buffer layer to the isolating layer are each defined with the through hole. Therefore, all inorganic layers are each defined with the through hole on an area of the display panel. Thus, stresses on each inorganic layer of the display panel can be reduced, and an overall stress on the display panel can be reduced. As a result, the display panel can be prevented from breakage due to stresses concentrating on corners of the display panel.

In one embodiment, as shown in FIG. 6, the through hole 23 comprises a first through hole 231 formed in the buffer layer 212, and a second through hole 232 formed in the gate insulating layer 241, the interlayer insulating layer 215, the first inorganic layer 216, the second inorganic layer 218, and the isolating layer 511. By forming the first through hole in the buffer layer, cracks generated when the display panel is cut can be prevented from extending inwardly. Furthermore, stresses can be reduced by the first through hole, the second through hole, and the stress-buffering components disposed in the first through hole and the second through hole. Therefore, the display panel can be prevented from breakage due to stress concentration.

In one embodiment, as shown in FIG. 6, a projection of the first through hole 231 overlaps with a projection of the second through hole 232 on the substrate 211. That is, when the first through hole and the second through hole are formed, a through hole directly penetrates the buffer layer, the first gate insulating layer, the second gate insulating layer, the interlayer insulating layer, the first inorganic layer, the second inorganic layer, and the isolating layer to sequentially form the first through hole and the second through hole. Therefore, a manufacturing process can be simplified. Moreover, the first through hole and the second through are formed in the inorganic layers in the bending area in the display panel, thereby reducing stresses on the display panel, improving malleability of the display panel, and preventing the display panel from breakage.

In one embodiment, a projection of the second through hole is within a projection of the first through hole on the substrate. That is, when the first through hole and the second through hole are defined, a width of a section of the second through hole may be designed to be greater than a width of a section of the first through hole. Therefore, bending performance of the display panel may be further improved, and the display panel may be prevented from breakage due to stress concentration.

In one embodiment, as shown in FIG. 5, the first area 221 is defined with at least two through holes 23. The at least two through holes 23 are evenly distributed along a curved surface of the display panel in the first area 221. Each corner of the display panel is defined with a plurality of through holes, thereby reducing stresses generated during a bending process and preventing the layers of the display panel from breakage due to stress concentration. Specifically, the through holes are evenly defined along the curved surface of the display panel, and the stress-buffering component is disposed at a certain distance. As a result, stresses would not concentrate during a bending process. However, embodiments of the present disclosure are not limited to the above-mentioned description. The through holes at corners of the display panel may also be arranged in a grid manner or an array manner. Therefore, stresses can be reduced by the through holes and the stress-buffering components, malleability of the display panel can be improved, and the display panel can be prevented from breakage.

In one embodiment, a distance between a projection of the first through hole and a projection of the second through hole on the substrate is greater than 0. When forming the first through hole and the second through hole, the first through hole and the second through hole are alternately arranged to ensure complete encapsulation of the display panel and prevent moisture and oxygen from entering the display panel. The first through hole and the second through hole are not arranged in the same vertical position, so that moisture and oxygen can enter from the first through hole of the substrate and the buffer layer. However, because the first through hole and the second through hole are not connected to each other, moisture and oxygen would not further enter a display material layer and a metal layer, which would lead to abnormal display.

In one embodiment, a distance between a projection of the first through hole on the substrate and an edge of the display panel is greater than a distance between the second through hole and the edge of the display panel. Specifically, when forming the first through hole and the second through hole, the first through hole and the second through hole are not arranged in the same vertical position. Furthermore, the second through hole is defined farther away from a center of the display panel to further prevent moisture and oxygen from entering the display panel. The first through hole and the second through hole are not connected to each other. Since the second through hole is defined farther away from the center of the display panel, a path followed by moisture and oxygen becomes longer. Therefore, even if moisture and oxygen entered the first through hole and then the second through hole, they would not enter the luminescent material layer and the metal layer. As a result, moisture and oxygen are prevented from entering the display panel when the through holes are formed.

Figure 7:
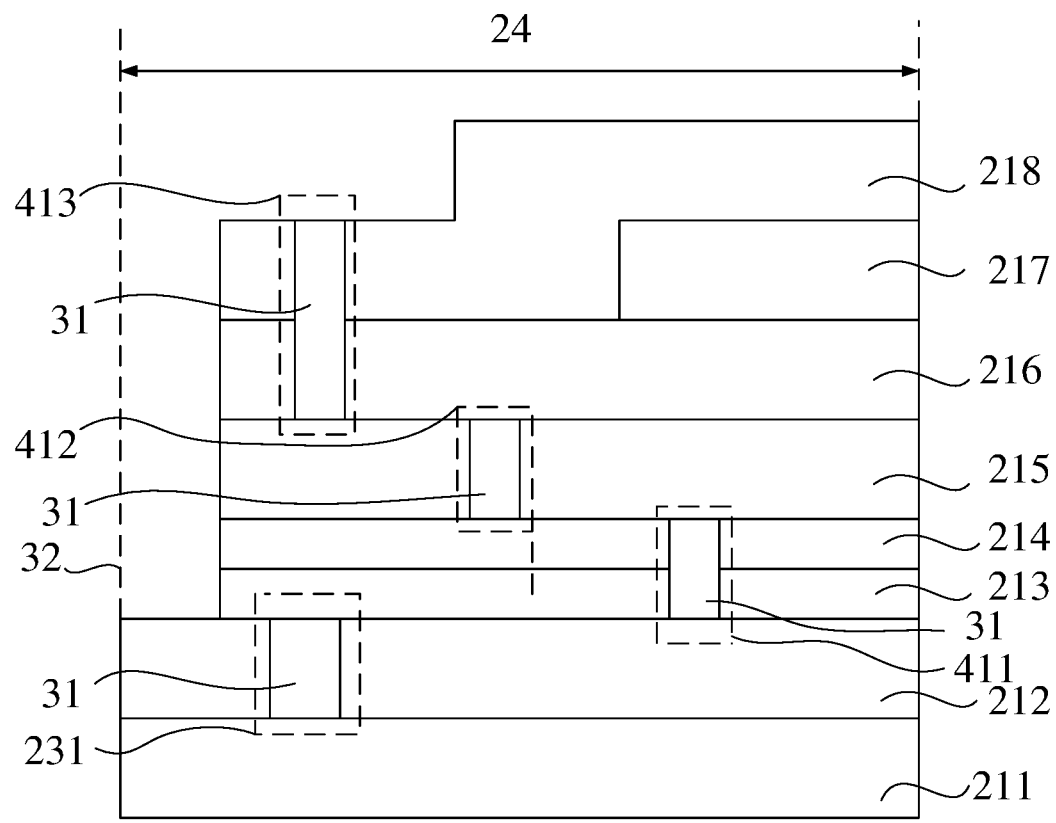
FIG. 7 is a third schematic view showing the display panel provided by an embodiment of the present disclosure.

In one embodiment, as shown in FIG. 7, the second through hole 232 comprises a first sub-through hole 411 formed in the gate insulating layer 241, a second sub-through hole 412 formed in the interlayer insulating layer 215, and a third sub-through hole 413 formed in the encapsulation layer 242. A distance between any two of a projection of the first sub-through hole 411, a projection of the second sub-through hole 412, and a projection of the third sub-through hole 413 on the substrate 211 is greater than 0. When forming the second through hole, not only encapsulation performance of the display panel, but also bending performance of the display panel should be considered, thereby preventing stresses concentrating at areas corresponding to corners of the display panel. The sub-through holes in each layer of the second through hole are defined in different vertical positions, making each of the sub-through holes distributed in different positions. Therefore, when the corners of the display panel are bent, stresses can be alleviated no matter where they occur. This is because the sub-through holes provided with the stress-buffering component 31 are distributed in different areas, which reduces a possibility of stress concentration and prevents the display panel from breakage.

As shown in FIG. 7, to clearly illustrate distances between different sub-through holes, the sub-through holes extend to an area corresponding to the organic layer. However, when the sub-through holes are defined, the sub-through holes should be prevented from extending to the area corresponding to the organic layer.

In one embodiment, the second through hole comprises the first sub-through hole formed in the gate insulating layer, the second through hole formed in the interlayer insulating layer, and the third through hole formed in the encapsulation layer. A width of the second sub-through hole is greater than a width of the first sub-through hole and a width of the third through hole. Furthermore, A projection of the first sub-through hole and a projection of the third sub-through hole are within a projection of the second sub-through hole on the substrate. Specifically, during a bending process, stresses may concentrate on the interlayer insulating layer. Therefore, a size of the sub-through holes formed in the interlayer insulating layer may be larger than the sub-through holes formed in other layers. As a result, a stress-buffering effect of a layer where stresses concentrate is improved, and the display panel is prevented from breakage due to stress concentration.

In embodiments of the present disclosure, conductive layers are not described. The conductive layers comprise, but are not limited to, a first metal layer, a second metal layer, a source/drain layer, a pixel electrode layer, and a common electrode layer. The conductive layers may be disposed or may not be disposed at a second plane of the display area at an edge of the display panel. In embodiments of the present disclosure, because the conductive layers have a certain malleability and would be patterned, they are not shown in the drawings. However, embodiments of the present disclosure are not limited thereto. For example, when forming the through holes in the conductive layers, the conductive layers may also be defined with the through holes.

In one embodiment, the display panel comprises a planarization layer 513 disposed on the interlayer insulating layer 215 away from the substrate 211. The planarization layer 513 is filled in the sub-through hole to form a first part of the stress-buffering component 311. The first sub-through hole 411 is filled with a second part of the stress-buffering component 312. The third sub-through hole 413 is filled with a third part of the stress-buffering component 313. That is, when respectively forming the first sub-through hole 411, the second sub-through hole 412, and the third sub-through hole 413, the planarization layer 513 is formed on the second sub-through hole 412. Therefore, the second sub-through hole 412 is filled with the planarization layer after the second sub-through hole 412 is formed, thereby simplifying processes. At the same time, the inorganic layer is formed on the first sub-through hole 411 and the third sub-through hole 413 and is directly filled in the first sub-through hole 411 and the third sub-through hole 413, thereby improving flexibility of the display panel.

In one embodiment, a material of the stress-buffering component comprises an organic material, thereby reducing stresses on the display panel. For example, an organic layer in the encapsulation layer is an organic material, and a material of the stress-buffering component and a material of the organic layer may be same. Specifically, the material of the stress-buffering component comprises polyimide or resin.

In one embodiment, as shown in FIG. 6, the display device further comprises a planarization layer 512 disposed in a direction of the touch control layer 511 away from the encapsulation layer 242. When forming the through holes in the display device and patterning layers of the display device, the planarization layer is formed on a surface of the display device to solve a problem of an uneven surface. Therefore, the display device has a flat surface, which is beneficial for manufacturing other layers or components.

In one embodiment, as shown in FIG. 6, the display panel further comprises a planarization layer 512 disposed in a direction of the touch control layer 511 away from the substrate 211 and is filled in the through hole 23 to form the stress-buffering component 31. That is, when disposing the stress-buffering component, the planarization layer of the display panel may extend into the through holes to form the stress-buffering component, thereby reducing stresses on the display panel.

In one embodiment, a material of the planarization layer comprises an organic material comprising resin or polyimide.

In one embodiment, the material of the stress-buffering component and the material of the planarization layer are same. That is, when disposing the stress-buffering component, the material of the stress-buffering component and the material of the planarization layer may be same. The material of the planarization layer may be used directly to manufacture the stress-buffering component.

Figure 8:
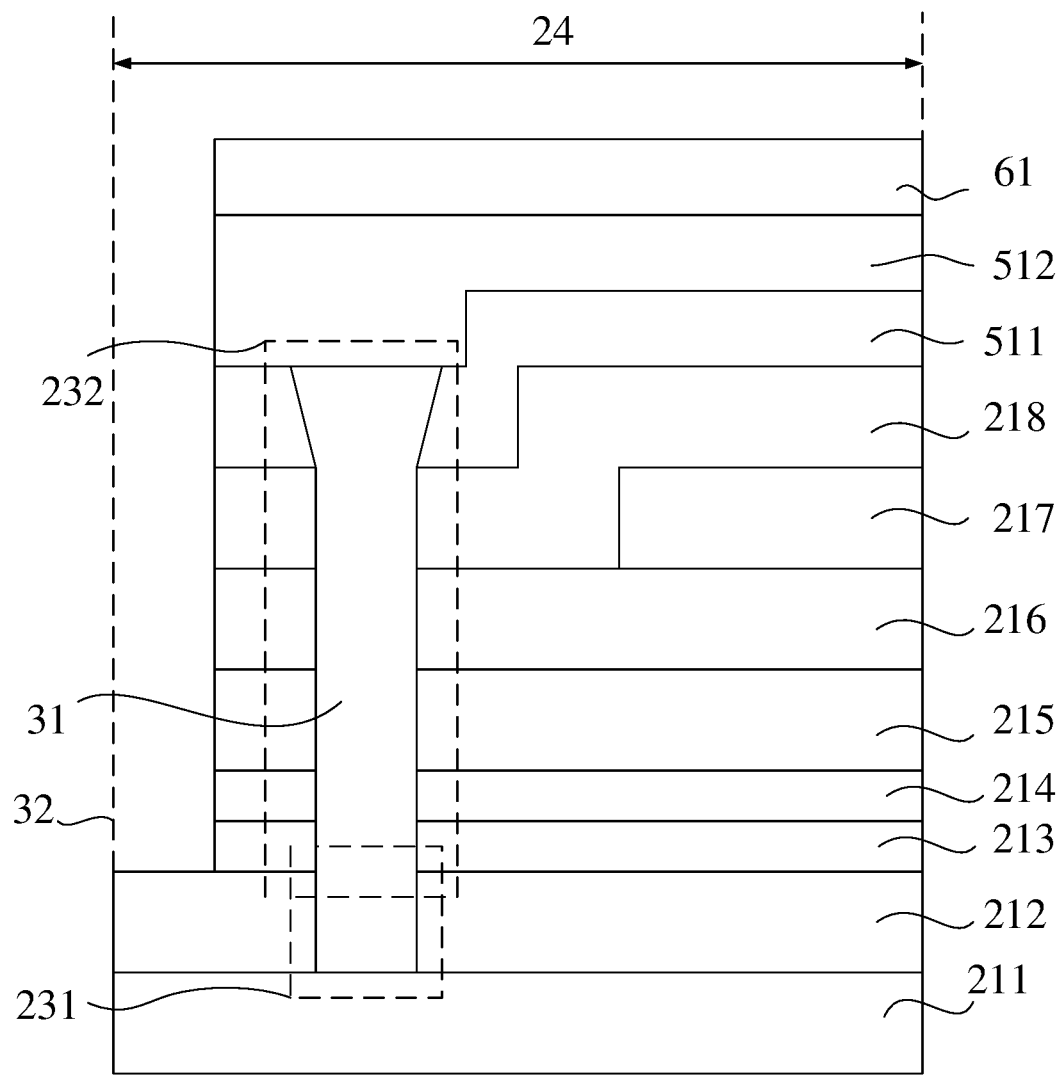
FIG. 8 is a schematic view showing a display device provided by an embodiment of the present disclosure.

As shown in FIG. 5 and FIG. 8, an embodiment of the present disclosure provides a display device, comprising:
  a display panel, wherein the display panel comprises a display area 21 and a non-display area 24 defined around the display area 21. The display panel comprises a substrate 211, a driving circuit layer, and an encapsulation layer 242. The driving circuit layer is disposed on a side of the substrate 211. The encapsulation layer 242 is disposed on a side of the driving circuit layer away from the substrate 211. The encapsulation layer 242 comprises a first inorganic layer 216, an organic layer 217, and a second inorganic layer 218. Wherein, at four corners of the display panel where the first inorganic layer 216 and the second inorganic layer 218 are attached in the non-display area 24, the display panel is defined with a through hole 23 filled with a stress-buffering component 31 configured to reduce stress.

The display device further comprises a cover plate 61 disposed on a side of the display panel.

An embodiment of the present disclosure provides a display device, comprising a display panel and a cover plate. At four corners of the display panel where a first inorganic layer and a second inorganic layer are attached in a non-display area, the display panel is defined with a through hole filled with a stress-buffering component configured to reduce stress. As a result, the stress-buffering component can reduce stresses on a bending area of the display panel, and the display panel can be prevented from breakage due to stress concentration.

In some embodiments, in the display device, the display panel comprises a first area, a second area, a third area, and a fourth area at four corners of the display panel, and the first area, the second area, the third area, and the fourth area are each defined with the through hole.

In some embodiments, in the display device, the display panel further comprises a buffer layer and a touch control layer, the driving circuit layer comprises a gate insulating layer and an interlayer insulating layer, the touch control layer comprises an isolating layer, the through hole penetrates at least one of the buffer layer, the gate insulating layer, the interlayer insulating layer, the first inorganic layer, the second inorganic layer, or the isolating layer.

In one embodiment, in the display device, the through hole comprises a first through hole formed in the buffer layer and a second through hole formed in the gate insulating layer, the interlayer insulating layer, the first inorganic layer, the second inorganic layer, and the isolating layer.

In one embodiment, in the display device, a projection of the first through hole overlaps a projection of the second through hole on the substrate.

In one embodiment, in the display device, the first area is defined with at least two through holes, and the at least two through holes are evenly distributed along a curved surface of the display panel in the first area.

In one embodiment, in the display device, a distance between a projection of the first through hole and a projection of the second through hole on the substrate is greater than 0.

In one embodiment, in the display device, the second through hole comprises a first sub-through hole formed in the gate insulating layer, a second sub-through hole formed in the interlayer insulating layer, and a third sub-through hole formed in the encapsulation layer, and a distance between any two of a projection of the first sub-through hole, a projection of the second sub-through hole, and a projection of the third sub-through hole on the substrate is greater than 0.

In one embodiment, in the display device, the display panel comprises a planarization layer disposed in a direction of the interlayer insulating layer away from the substrate and filled in the second sub-through hole to form a first part of the stress-buffering component, a second part of the stress-buffering component is filled in the first sub-through hole, and a third part of the stress-buffering component is filled in the third sub-through hole.

Figure 9:
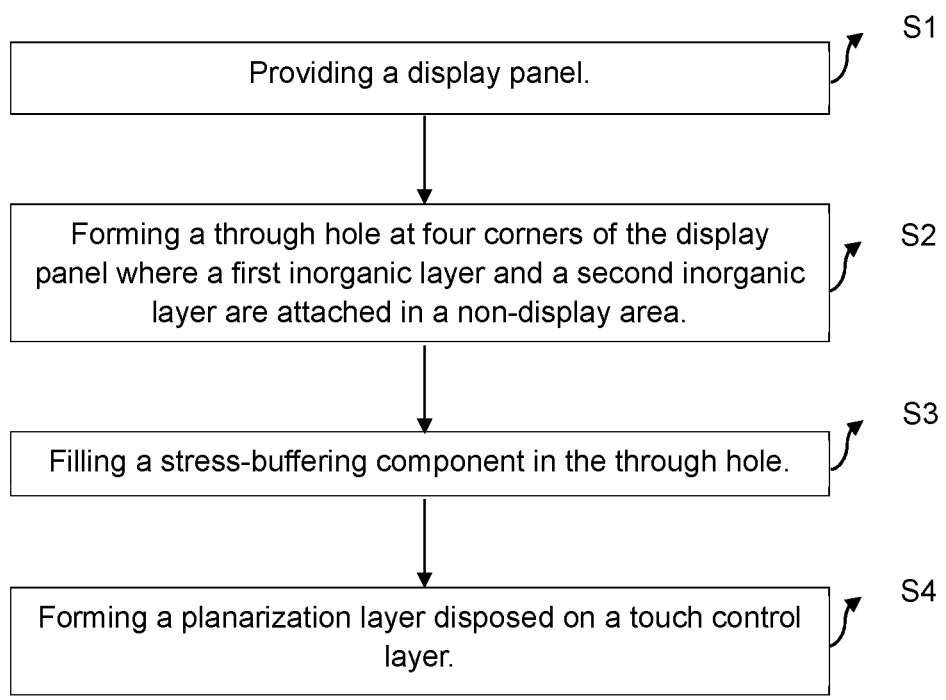
FIG. 9 is a flowchart showing a method of manufacturing the display device provided by an embodiment of the present disclosure.
Figure 10A:
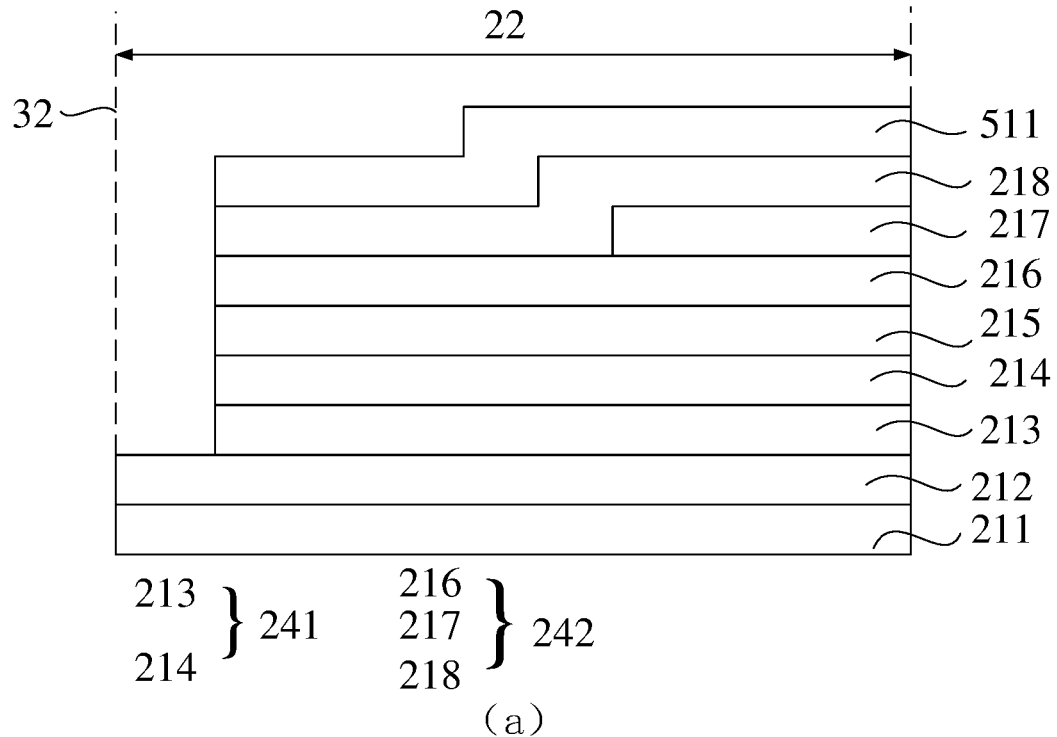
FIG. 10a is a first schematic view showing a display device corresponding to the manufacturing method provided by an embodiment of the present disclosure.
Figure 10A:
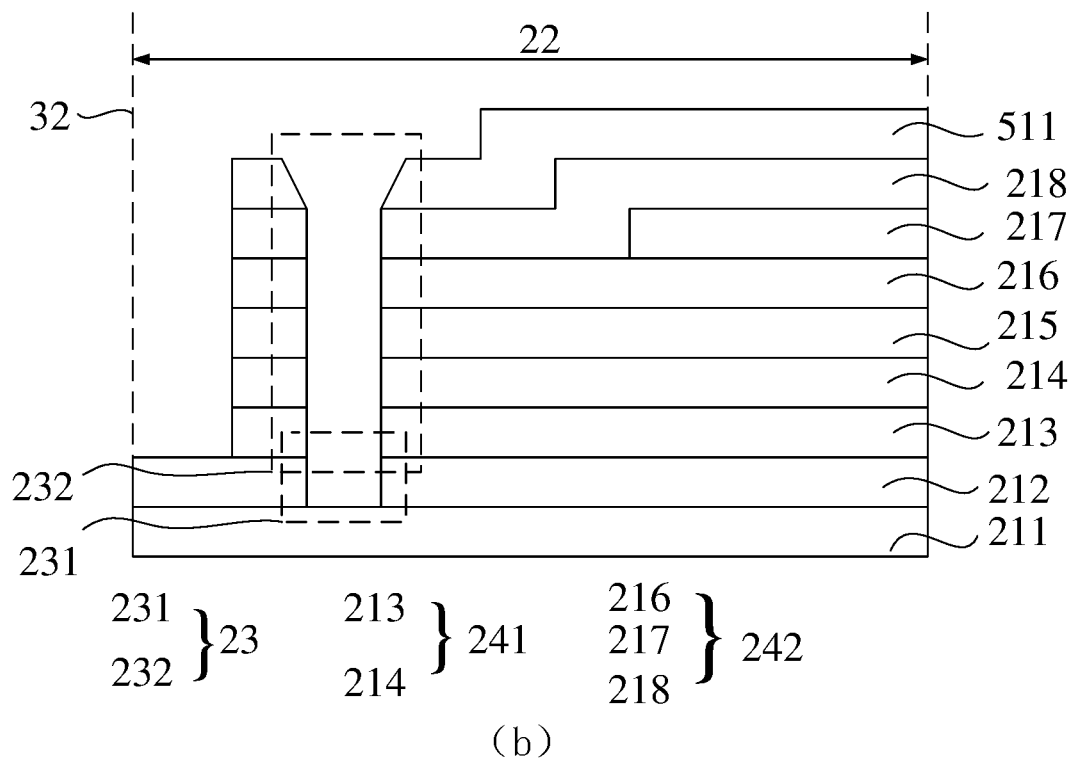

As shown in FIG. 9, an embodiment of the present disclosure provides a method of manufacturing a display device, comprising:
  S1, providing a display panel. The display panel comprises a display area and a non-display area surrounding the display panel. The display panel comprises a substrate, a driving circuit layer, and an encapsulation layer. The driving circuit layer is disposed on a side of the substrate. The encapsulation layer is disposed on a side of the driving circuit layer away from the substrate. The encapsulation layer comprises a first inorganic layer, an organic layer, and a second inorganic layer. Please refer to (a) in FIG. 10a.

S2, forming a through hole at four corners of the display panel where the first inorganic layer and the second inorganic layer are attached in the non-display area. Please refer to (b) in FIG. 10*a*.

Figure 10B:
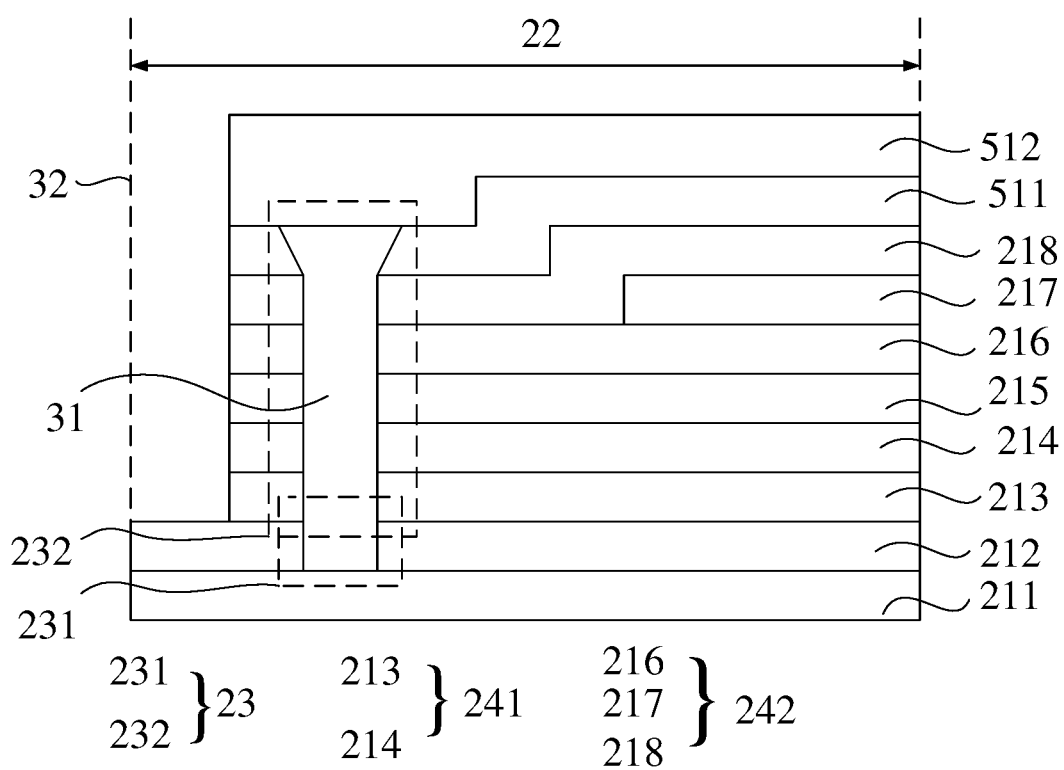
FIG. 10b is a second schematic view showing the display device corresponding to the manufacturing method provided by an embodiment of the present disclosure.
Figure 11:
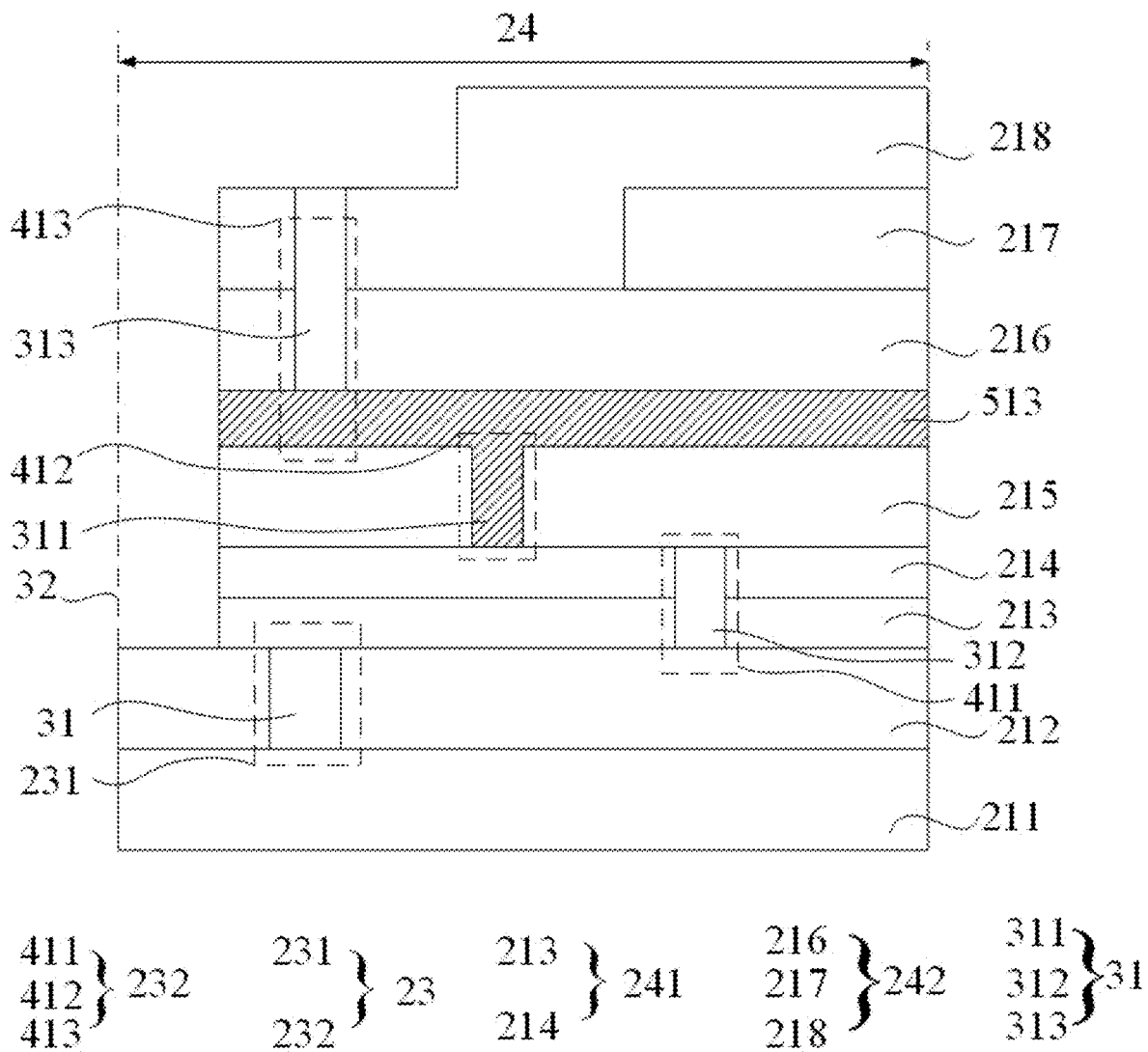
FIG. 11 is a fourth schematic view showing the display panel provided by an embodiment of the present disclosure.
Figure 12:
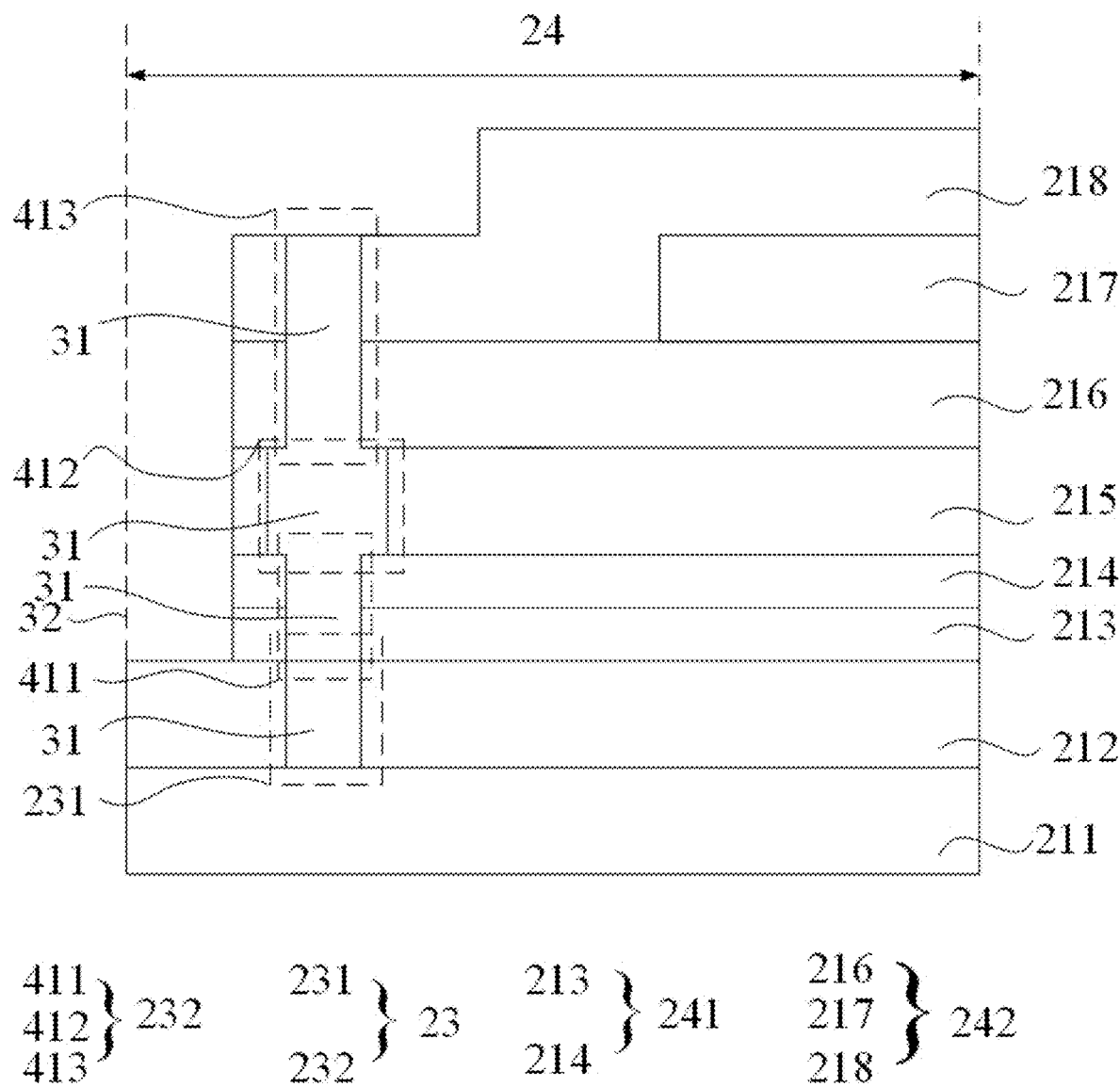
FIG. 12 is a fifth schematic view showing the display panel provided by an embodiment of the present disclosure.

S3, filling a stress-buffering component in the through hole. The stress-buffering component is configured to reduce stress. Please refer to FIG. 10*b*.

S4, forming a planarization layer disposed on the touch control layer. Please refer to FIG. 10*b*.

An embodiment of the present disclosure provides a method of manufacturing a display device. A through hole formed according to the method is defined by etching where a first inorganic layer and a second inorganic layer are attached in a non-display area using a mask plate. The through hole prevents cracks formed during a cutting process of the display panel from extending. Stresses on a second plane display area are reduced by a first through hole, a second through hole, and a stress-buffering component, and the display panel can be prevented from breakage due to stress concentration.

In one embodiment, when a distance between a projection of the second through hole on the substrate and a projection of the first through hole on the substrate is greater than 0, the first through hole may be formed first. A stress-buffering component is disposed in the first through hole. Then, a gate insulating layer, an interlayer insulating layer, an encapsulation layer, and an isolating layer are formed on a buffer layer. After that, the second through hole is formed in the gate insulating layer, the interlayer insulating layer, the encapsulation layer, and the isolating layer, and a stress-buffering layer is formed in the second through hole. Finally, the first through hole and the second through hole are formed. Through holes defined in different areas may also be formed according to the above-mentioned method.

According to the above-mentioned embodiments,

Embodiments of the present disclosure provide a display panel and a display device. The display panel comprises a display area and a non-display area defined around the display area. The display panel comprises a substrate, a driving circuit layer, and an encapsulation layer. The driving circuit layer is disposed on a side of the substrate. The encapsulation layer is disposed on a side of the driving circuit layer away from the substrate. The encapsulation layer comprises a first inorganic layer, an organic layer, and a second inorganic layer. At four corners of the display panel where the first inorganic layer and the second inorganic layer are attached in the non-display area, the display panel is defined with a through hole filled with a stress-buffering component configured to reduce stress. Since stresses on the bending area of the display panel are reduced by the stress-buffering component, the display panel is prevented from breakage due to stress concentration.

In the above-mentioned embodiments, the focus of each embodiment is different, and for a part that is not detailed in an embodiment, reference may be made to related descriptions of other embodiments.

A display panel, a display device, and a manufacturing thereof have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display panel, comprising a display area and a non-display area disposed around the display area, wherein the display panel comprises:
    a substrate;
    a driving circuit layer disposed on a side of the substrate; and
    an encapsulation layer disposed on a side of the driving circuit layer away from the substrate, wherein the encapsulation layer comprises a first inorganic layer, an organic layer, and a second inorganic layer;
    wherein at four corners of the display panel where the first inorganic layer and the second inorganic layer are attached in the non-display area, the display panel is defined with a through hole filled with a stress-buffering component to reduce stress;
    wherein the display panel further comprises a buffer layer and a touch control layer, the driving circuit layer comprises a gate insulating layer and an interlayer insulating layer, the touch control layer comprises an isolating layer;
    wherein the through hole comprises a first through hole formed in the buffer layer and a second through hole formed in the gate insulating layer, the interlayer insulating layer, the first inorganic layer, the second inorganic layer, and the isolating layer;
    wherein the second through hole comprises a first sub-through hole penetrating through the gate insulating layer, a second sub-through hole penetrating through the interlayer insulating layer, and a third sub-through hole penetrating through the encapsulation layer; and
    wherein a width of the second sub-through hole is greater than a width of the first sub-through hole and a width of the third through hole, and a projection of the first sub-through hole and a projection of the third sub-through hole are within a projection of the second sub-through hole on the substrate.

2. The display panel of claim 1, wherein the display panel comprises a first area, a second area, a third area, and a fourth area at the four corners of the display panel, and the first area, the second area, the third area, and the fourth area are each defined with the through hole.

3. The display panel of claim 1, wherein a projection of the first through hole overlaps part of a projection of the second through hole on the substrate.

4. The display panel of claim 2, wherein the first area is defined with at least two through holes, and the at least two through holes are evenly distributed along a curved surface of the display panel in the first area.

5. The display panel of claim 1, wherein a distance between a projection of the first through hole and a projection of the second through hole on the substrate is greater than 0.

6. The display panel of claim 1, wherein the display panel further comprises a planarization layer disposed in a direction of the interlayer insulating layer away from the substrate and filled in the second sub-through hole to form a first part of the stress-buffering component, a second part of the stress-buffering component is filled in the first sub-through hole, and a third part of the stress-buffering component is filled in the third sub-through hole.

7. The display panel of claim 1, wherein the stress-buffering component comprises an organic material.

8. The display panel of claim 1, further comprising a planarization layer disposed in a direction of the touch control layer away from the substrate and filled in the through hole to form the stress-buffering component.

9. The display panel of claim 1, wherein a section of the second sub-through hole is square.

10. The display panel of claim 1, wherein a section of the third sub-through hole is square.

11. The display panel of claim 1, wherein a section of the first through hole is square.

12. A display device, comprising a display panel and a cover plate disposed on a side of the display panel;
wherein the display panel comprises a display area and a non-display area disposed around the display area, the display panel comprises a substrate, a driving circuit layer, and an encapsulation layer, the driving circuit layer is disposed on a side of the substrate, the encapsulation layer is disposed on a side of the driving circuit layer away from the substrate, and the encapsulation layer comprises a first inorganic layer, an organic layer, and a second inorganic layer;
wherein at four corners of the display panel where the first inorganic layer and the second inorganic layer are attached in the non-display area, the display panel is defined with a through hole filled with a stress-buffering component to reduce stress;
wherein the display panel further comprises a buffer layer and a touch control layer, the driving circuit layer comprises a gate insulating layer and an interlayer insulating layer, the touch control layer comprises an isolating layer;
wherein the through hole comprises a first through hole formed in the buffer layer and a second through hole formed in the gate insulating layer, the interlayer insulating layer, the first inorganic layer, the second inorganic layer, and the isolating layer;
wherein the second through hole comprises a first sub-through hole penetrating through the gate insulating layer, a second sub-through hole penetrating through the interlayer insulating layer, and a third sub-through hole penetrating through the encapsulation layer; and
wherein a width of the second sub-through hole is greater than a width of the first sub-through hole and a width of the third through hole, and a projection of the first sub-through hole and a projection of the third sub-through hole are within a projection of the second sub-through hole on the substrate.

13. The display device of claim 12, wherein the display panel comprises a first area, a second area, a third area, and a fourth area at the four corners of the display panel, and the first area, the second area, the third area, and the fourth area are each defined with the through hole.

14. The display device of claim 12, wherein a projection of the first through hole overlaps part of a projection of the second through hole on the substrate.

15. The display device of claim 13, wherein the first area is defined with at least two through holes, and the at least two through holes are evenly distributed along a curved surface of the display panel in the first area.

16. The display device of claim 12, wherein a distance between a projection of the first through hole and a projection of the second through hole on the substrate is greater than 0.

17. The display device of claim 12, wherein the display panel further comprises a planarization layer disposed in a direction of the interlayer insulating layer away from the substrate and filled in the second sub-through hole to form a first part of the stress-buffering component, a second part of the stress-buffering component is filled in the first sub-through hole, and a third part of the stress-buffering component is filled in the third sub-through hole.

18. The display device of claim 12, wherein a section of the second sub-through hole is square.

19. The display device of claim 12, wherein a section of the third sub-through hole is square.

20. The display device of claim 12, wherein a section of the first through hole is square.

\* \* \* \* \*